US 7,117,476 B2

(12) United States Patent
Bach et al.

(10) Patent No.: US 7,117,476 B2
(45) Date of Patent: Oct. 3, 2006

(54) DETERMINING FEASIBILITY OF IC EDITS

(75) Inventors: John M. Bach, Sugar Land, TX (US); Rand B. Carawan, Stafford, TX (US); Hemant Joshi, Plano, TX (US); David A. Thomas, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 361 days.

(21) Appl. No.: 10/861,294

(22) Filed: Jun. 4, 2004

(65) Prior Publication Data
US 2005/0273745 A1 Dec. 8, 2005

(51) Int. Cl.
*G06F 17/50* (2006.01)

(52) U.S. Cl. .............................. 716/21; 716/19; 716/20

(58) Field of Classification Search ............. 716/19–21
See application file for complete search history.

(56) References Cited

U.S. PATENT DOCUMENTS

| | | | | |
|---|---|---|---|---|
| 5,392,222 A | * | 2/1995 | Noble | 716/19 |
| 5,675,499 A | * | 10/1997 | Lee et al. | 716/19 |
| 6,557,162 B1 | * | 4/2003 | Pierrat | 716/21 |
| 2002/0166103 A1 | * | 11/2002 | Rittman et al. | 716/11 |
| 2005/0216877 A1 | * | 9/2005 | Pack et al. | 716/19 |

* cited by examiner

*Primary Examiner*—Vuthe Siek
*Assistant Examiner*—Naum Levin
(74) *Attorney, Agent, or Firm*—Robert D. Marshall, Jr.; W. James Brady; Frederick J. Telecky, Jr.

(57) ABSTRACT

A computer method of analyzing an integrated circuit ("IC") masked design data, comprising grouping into a cluster areas of layers preceding a target metal layer that are suitable for milling, deleting portions of the target metal layer that do not meet minimum tool spacing requirements to produce a modified metal layer, deleting portions of the modified metal layer that do not meet minimum design rule width requirements to produce a final metal layer, and comparing the final metal layer and the cluster to identify common areas.

21 Claims, 3 Drawing Sheets

DETERMINING FEASIBILITY OF IC EDITS

BACKGROUND

Integrated circuits ("IC") generally are mass-produced by various design/manufacturing companies and then sold to client companies. Often, client companies may have a need to edit (i.e., adjust circuitry by physically altering the circuitry) certain ICs (e.g., flip-chip circuits) using focused ion beam ("FIB") milling technology to better suit a particular application or function the client is trying to implement. To edit an IC, engineers at the client company may mark suggested IC "edits" on an electronic masked design data of the IC and submit the masked design data to the design/manufacturing company.

Engineers at the design/manufacturing company then may manually evaluate the masked design data with the suggested changes incorporated therein by conducting a feasibility study. In a feasibility study, the engineers determine whether the suggested edits are possible, aggressive, conservative, and/or on a boundary between locations suitable and not suitable for editing. Specifically, the engineers must determine whether the suggested edits are at all feasible, whether the edits are aggressive in nature and carry a substantial risk of failure, whether the edits are conservative in nature and have a substantial probability of success, and whether the edits are located on a boundary between suitable and non-suitable editing locations. Such evaluations generally are manually performed, wherein engineers use their own knowledge of IC design rules and milling (i.e., etching) procedures to determine whether the suggested edits are feasible.

However, there exist numerous disadvantages to manually determining whether a particular IC edit is feasible. For example, engineers usually are unable to thoroughly and efficiently analyze an IC to determine whether a suggested edit is truly feasible, since engineers rely on personal experience and IC editing knowledge, which may be limited or incomplete. Further, if an edit is determined to be unfeasible, engineers may find it difficult to suggest an effective alternative to the suggested edit, even though such a viable alternative may exist. Further still, engineers typically are not able to incorporate the physics of milling machinery into editing considerations, since such considerations would become prohibitively intensive and difficult. For similar reasons, engineers generally do not rely on explicit IC design rules. Often, visually-inspected edit suggestions are rejected based solely on an engineer's impression of the difficulty level of the proposed edit, even though such an edit may have a reasonable chance for success. For these and various other reasons, engineers often cannot accurately, efficiently and effectively determine the probability of a successful IC edit, nor can engineers consistently provide viable alternatives to unsuitable, proposed IC edits.

BRIEF SUMMARY

The problem noted above may be solved at least in part by an automated computer method of analyzing an IC to identify potential editing locations. In at least some embodiments, the computer method comprises grouping into a cluster areas of layers preceding a target metal layer that are suitable for milling, deleting portions of the target metal layer that do not meet minimum tool spacing requirements to produce a modified metal layer, deleting portions of the modified metal layer that do not meet minimum spacing rule width requirements to produce a final metal layer, and comparing the final metal layer and the cluster to identify common areas.

BRIEF DESCRIPTION OF THE DRAWINGS

For a detailed description of exemplary embodiments of the invention, reference will now be made to the accompanying drawings in which.

NOTATION AND NOMENCLATURE

Figure 1A:
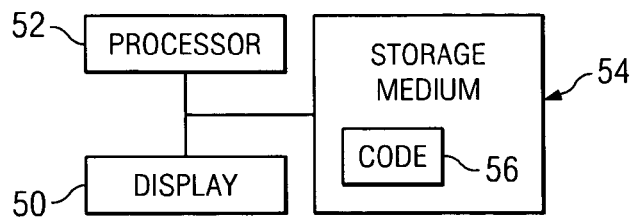
FIG. 1a shows a system implementing a process in accordance with embodiments of the invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Various numeric values are provided below, many of which merely to exemplify a preferred embodiment and should not be used to limit the scope of this disclosure. Also, all numeric values are approximate. Further, the term "adjacent" is generally meant to be interpreted as "abutting" and/or "immediately next to," although in some embodiments, the term may be interpreted as "near" or "in close proximity to." Thus, two adjacent items may abut one another or be separated by an intermediate item(s).

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Described herein is an automated process of accurately and thoroughly analyzing an IC to determine the feasibility of various proposed IC edits. Such a feasibility study may comprise determining whether milling (e.g., using focused ion beam or "FIB" tools) to a particular metal layer in the IC without violating design rules is possible, which of a variety of milling sites will be the most conservative (i.e., least likely to damage surrounding structures) and provide the greatest clearance, and so forth. The preferred process may comprise an algorithm that uses design rules, FIB machinery characteristics and various IC properties to perform mathematical calculations and generate empirical data in order to determine whether a proposed edit is feasible.

Results of the process may be generated in the form of a computer file. For example, the process may analyze the IC and determine various portions of the IC that are suitable for milling and editing, and then produce a computer file (e.g., a masked design data file in graphical design system stream format or Caltech Intermediate File format) indicating the locations suitable for editing by way of a "virtual layer." In some embodiments, the file may be merged with another computer file containing a masked design data of the original (unedited) IC, thus generating a new masked design data showing the virtual layer combined with (e.g., superimposed) the original IC masked design data. This new masked design data indicates suitable IC milling locations. If the proposed edit location does not fall within the boundaries of these suitable milling locations, the edit is considered not feasible. Otherwise, the edit is feasible. However, in at least some embodiments, the process may generate alternative IC locations suitable for milling and/or editing that accomplish the same objectives as the originally-proposed IC edit. The process also may identify and display certain equipment upgrade(s) that would make feasible a previously unfeasible IC edit, thus enabling engineers to make informed purchasing decisions.

A system implementing the process described above is shown in FIG. 1a. FIG. 1a illustrates a display 50 coupled to a processor 52. The processor 52 may be coupled with a storage medium 54 (e.g., volatile or non-volatile storage such as memory, etc.) storing, among other items, a processor-executable code 56 capable of causing the processor to perform the preferred process described herein. IC masked design datas, design rules, and other appropriate programs and files also may be stored in the storage medium 54. The processor 52 may retrieve and execute the code 56 to analyze the electronic IC masked design data and produce a virtual layer image that may be combined (e.g., superimposed) with an original version of the electronic IC masked design data to produce a final electronic masked design data. The final masked design data, indicating suitable milling locations and containing milling, editing, and other such recommendations, then may be displayed on the display 50 for use by the FIB tool operator, a designer, engineer or other appropriate end-user.

Figure 1B:
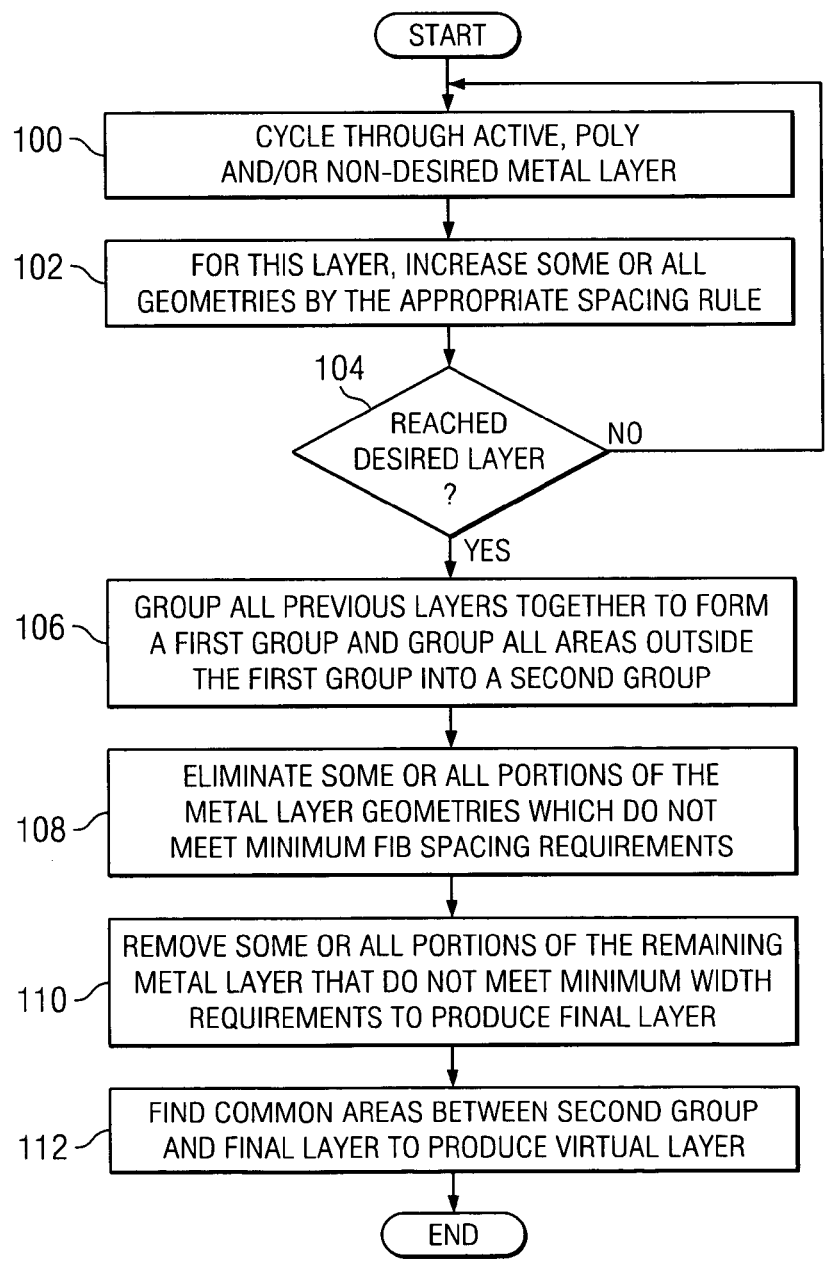
FIG. 1b shows the process in accordance with a preferred embodiment of the invention.
Figure 1C:
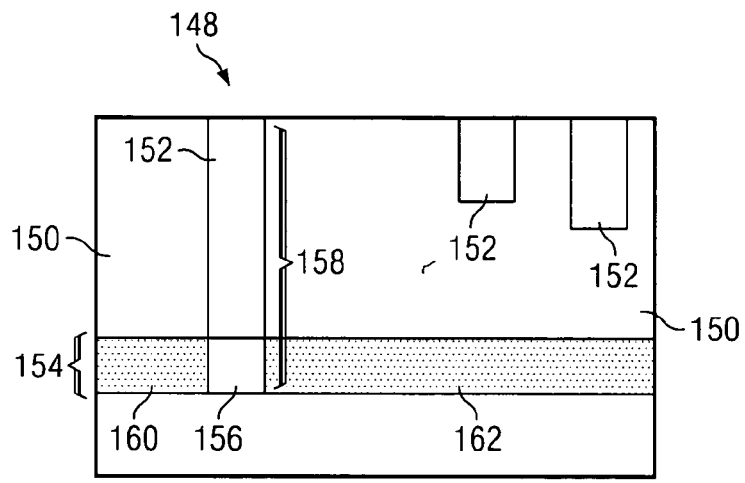
FIG. 1c shows an IC masked design data implementing the process of FIG. 1b in accordance with embodiments of the invention.

FIG. 1b illustrates an exemplary embodiment of the automated process described above. FIG. 1c shows a cross-sectional electronic IC masked design data 148 that may be subjected to the process of FIG. 1b. The process may be executed by first cycling through successive active, poly and non-desired metal layers of the electronic masked design data (block 100) until a desired metal layer masked design data 154 is reached. For example, if a suggested IC edit is located on a fourth metal layer of the IC, then the active, poly and metal layers preceding the fourth metal layer may be cycled through. In cycling through the layers preceding the fourth metal layer, the geometries of each layer are increased (e.g., magnified) by an appropriate spacing rule (block 102), to ensure that adequate clearance exists for a milling operation for that layer. As explained above, the process uses, among other things, an electronic masked design data file in any of a variety of formats, such as Graphical Design System stream format and/or Caltech Intermediate File format. The process also uses an IC layout verification rules file that contains various circuit design rules.

At least some portions of the desired metal layer masked design data 154, as well as some portions of the layers preceding the metal layer 154, do not meet FIB milling requirements (e.g., due to excessive circuit density that prevents adequate clearance) and thus are not suitable for milling procedures. Likewise, some portions of the metal layer 154 and layers preceding the metal layer 154 do not meet minimum design rule requirements (i.e., minimum width requirements) and also are not suitable for milling. Once the desired metal layer masked design data 154 that is to be edited is reached (block 104), some or all layers preceding the desired layer that are not suitable for a FIB milling operation are grouped into a first cluster 150. Some or all areas not grouped into the first cluster 150 (i.e., those areas meeting the minimum requirements) are grouped into a second cluster 152 (block 106). The purpose of these groupings is described below.

Some or all portions 160 of the desired metal layer masked design data 154 geometry that do not meet the minimum FIB tool spacing requirements subsequently are deleted from the electronic masked design data or otherwise removed from consideration as potential milling sites (block 108), resulting in a modified metal layer. These portions 160 are removed since the areas of the metal layer 154 containing the portions 160 would not provide sufficient clearance for a FIB milling operation. At least some of the portions 162 of the modified metal layer not meeting minimum width requirements (i.e., as specified by the design rules file described above) also are deleted from the electronic masked design data or otherwise removed from consideration (block 110). For example, at least some of the geometries of the modified metal layer are not wide enough to meet minimum width requirements as dictated by the design rules file. Because these geometries are not wide enough, they are not suitable for a FIB milling operation. Thus, these geometries are removed from consideration as potential milling/editing sites.

After eliminating portions 160 and 162 (marked with diagonal hashes as shown in FIG. 1c) from the desired metal layer masked design data 154, only a portion of the desired metal layer masked design data 154 remains. This resulting geometry 156 is suitable for a milling location. The geometry 156 is compared to the second group 152 to identify common/overlapping areas 158 (block 112). More specifically, as shown in FIG. 1c, geometry 156 overlaps with at least some of the second group 152, thus forming area 158. Because the area 158 meets FIB tool requirements and layout width requirements, the area 158 represents IC locations where there exists sufficient space to perform FIB edits to the desired metal layer 154. If the proposed IC edit locations fall within these common areas 158, the proposed IC edit is feasible and may be performed. However, if the proposed IC edit falls outside of the common areas, then the edit may not be feasible, and a message may be displayed indicating as such. In these cases, if the common areas contain geometries that may be edited to achieve the same end effect as the proposed edit, then such geometries may be proposed to the end-user.

Figure 2A:
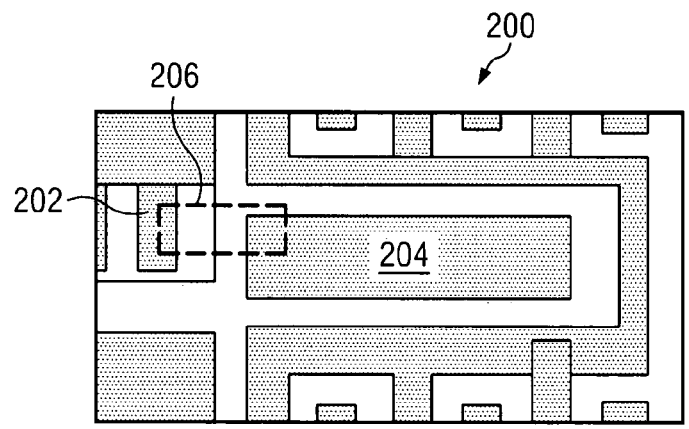
FIG. 2a shows an IC masked design data having a suggested edit location in accordance with embodiments of the invention.
Figure 2B:
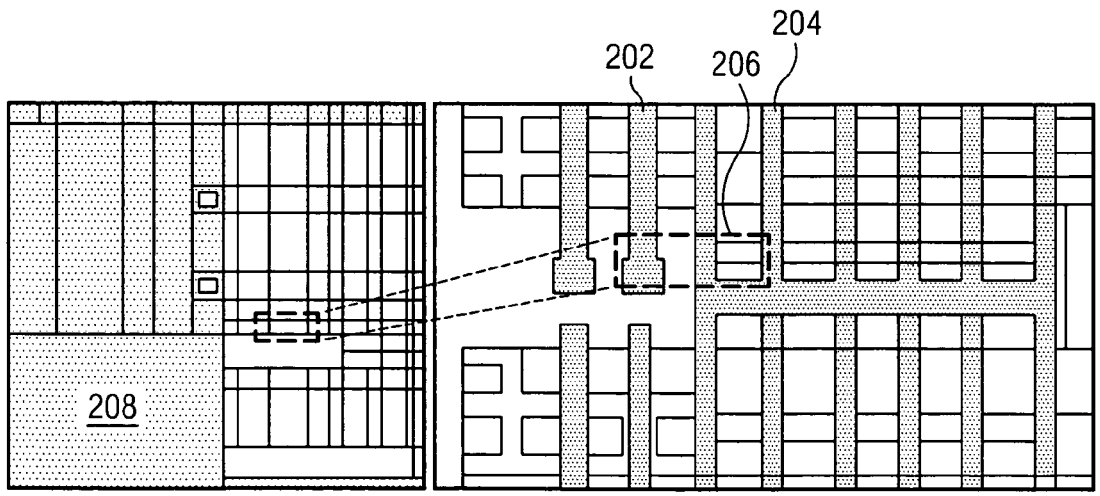
FIG. 2b shows a virtual layer superimposed adjacent the masked design data of FIG. 2a, in accordance with embodiments of the invention.

FIGS. 2a–2d illustrate an example of a graphical image (e.g., to present on the display 50 of FIG. 1a) that may be generated using the process described above. Specifically, the IC masked design data of FIG. 2a shows a first metal layer of an IC 200. The metal layer comprises, among other things, a structure 202 and a structure 204. The rectangle 206 indicates a suggested edit location, wherein the edit comprises electrically connecting the structure 202 and the structure 204. After the above automated process is performed, a graphical image merging the results of the process and the IC masked design data of FIG. 2a may be generated, as shown in FIG. 2b. A virtual layer 208 has been generated and superimposed adjacent (e.g., abutting) the first metal layer of the IC 200 and indicates portions of the IC 200 suitable for milling and editing. The rectangle 206 indicating the suggested edit location does not fall within the boundaries of the virtual layer 208. Thus, the proposed edit location is most likely not feasible. Further, because the virtual layer 208 does not contain any metal that may be electrically connected to another metal to achieve the same end result as that produced by the suggested edit location, no alternative edit that achieves such an end result is feasible.

Figure 2C:
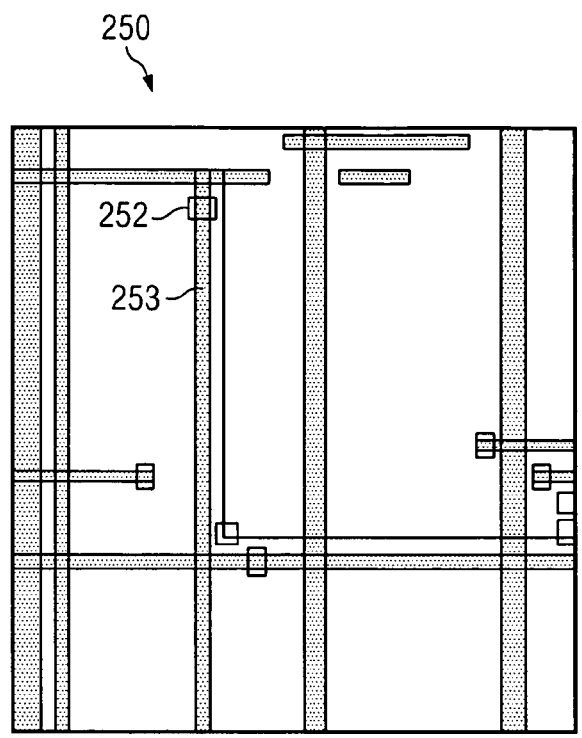
FIG. 2c shows a second IC masked design data having a suggested edit location in accordance with embodiments of the invention.
Figure 2D:
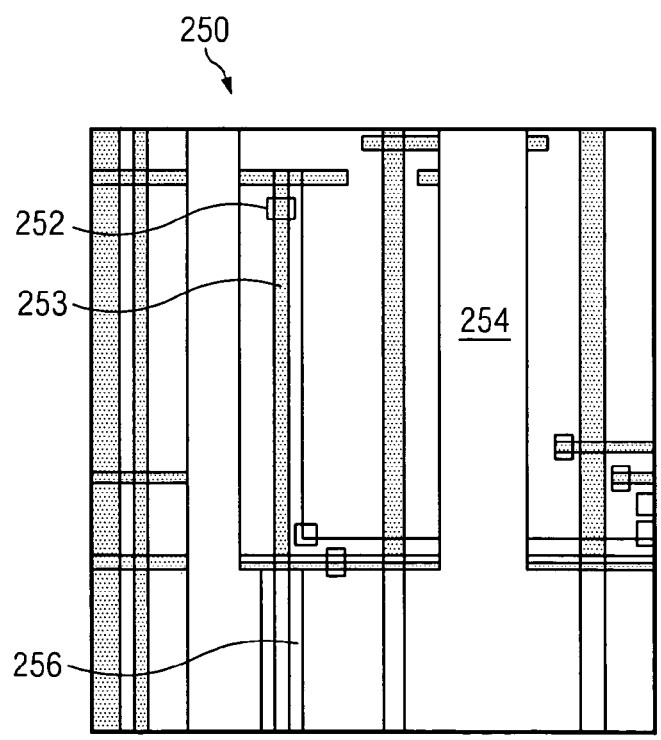
FIG. 2d shows a virtual layer superimposed adjacent the second masked design data of FIG. 2c, in accordance with embodiments of the invention.

FIG. 2c illustrates yet another example of a graphical image that may be generated for display on the display 50 using the process described above. The IC masked design data of FIG. 2c shows a fourth metal layer of an IC 250. The display comprises a rectangle 252 that indicates a proposed edit location, wherein the edit comprises cutting the fourth metal layer 253 connecting to a third metal layer connection for re-connection to another fourth metal layer connection. After performing the above process, a display merging results of the process and an IC 250 masked design data is shown in FIG. 2d. FIG. 2d comprises a virtual layer 254 that indicates portions of the IC 250 suitable for milling and editing. The rectangle 252 does not fall within the boundaries of the virtual layer 254. Accordingly, the proposed edit location at rectangle 252 is not feasible. However, other portions 256 of the metal 253 fall into the boundaries of the virtual layer 254. These portions 256 are suitable for milling and may be milled and edited as desired to produce the same end result as that produced by the suggested edit at the rectangle 252.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer method of analyzing an integrated circuit ("IC") masked design data, comprising:
   grouping into a cluster areas of layers preceding a target metal layer that are suitable for milling;
   deleting portions of the target metal layer that do not meet minimum tool spacing requirements to produce a modified metal layer;
   deleting portions of the modified metal layer that do not meet minimum design rule width requirements to produce a final metal layer; and
   comparing the final metal layer and the group of the cluster areas of layers preceding the target metal layer to identify common areas.

2. The method of claim 1, further comprising displaying the common areas.

3. The method of claim 1, further comprising merging a masked design data of the common areas with a masked design data of the IC to produce a new masked design data.

4. The method of claim 3, further comprising displaying the new masked design data.

5. The method of claim 1, further comprising determining whether a proposed edit location falls within the common areas.

6. The method of claim 5, further comprising determining an alternative edit location if the proposed edit location does not fall within the common areas.

7. The method of claim 6, further comprising displaying the alternative edit location.

8. The method of claim 5, wherein determining comprises displaying a message indicating whether the proposed edit location falls within the common areas.

9. The method of claim 1, wherein the steps of grouping, deleting, deleting and comparing comprise grouping, deleting, deleting and comparing from a backside of the IC masked design data.

10. The method of claim 9, wherein the steps of grouping, deleting, deleting and comparing from the backside of the IC masked design data comprise grouping, deleting, deleting and comparing from the backside of a flip-chip IC masked design data.

11. The method of claim 1, wherein the steps of grouping, deleting, deleting and comparing comprise grouping, deleting, deleting and comparing from a topside of the IC masked design data.

12. The method of claim 11, wherein the steps of grouping, deleting, deleting and comparing from the topside of the IC masked design data comprise grouping, deleting, deleting and comparing from the topside of a flip-chip IC masked design data.

13. The method of claim 1, wherein deleting portions of the target metal layer that do not meet minimum tool spacing requirements comprises eliminating portions of the target metal layer that do not meet minimum focused ion beam tool spacing requirements.

14. A system for evaluating a potential edit location on an electronic flip chip IC masked design data, comprising:
   a display;
   a processor coupled to the display;
   a memory coupled to the processor, said memory storing a processor-executable code, wherein, when executed, said code causes the processor to:
      group into a group areas of layers preceding a target metal layer that are suitable for milling;
      delete portions of the target metal layer that do not meet minimum tool spacing requirements to produce a modified metal layer;
      delete portions of the modified metal layer that do not meet minimum width requirements to produce a final metal layer; and
      generate a virtual layer that identifies areas common to both the target metal layer and the group of the cluster areas of layers preceding the target metal layer.

15. The system of claim 14, wherein the processor groups, deletes, deletes, and generates from a backside of the flip chip masked design data.

16. The system of claim 14, wherein the processor superimposes a masked design data of the virtual layer with a masked design data of the IC to produce a final masked design data.

17. The system of claim 16, wherein the display displays the final masked design data.

18. The system of claim 14, wherein the processor determines whether a technological upgrade would increase the number of suitable edit locations.

19. The system of claim 18, wherein the display displays a message describing whether the upgrade would increase the number of suitable edit locations.

20. The system of claim 14, wherein the processor determines whether a suggested edit location falls within the virtual layer.

21. The system of claim 20, wherein the display indicates whether the suggested edit location falls within the virtual layer.

* * * * *